(12) United States Patent
Aoki

(10) Patent No.: US 11,476,394 B2
(45) Date of Patent: Oct. 18, 2022

(54) LIGHT EMITTING DEVICE AND DISPLAY APPARATUS

(71) Applicant: SAMSUNG ELECTRONICS CO., LTD., Suwon-si (KR)

(72) Inventor: Dai Aoki, Yokohama (JP)

(73) Assignee: Samsung Electronics Co., Ltd., Suwon-si (KR)

(*) Notice: Subject to any disclaimer, the term of this patent is extended or adjusted under 35 U.S.C. 154(b) by 31 days.

(21) Appl. No.: 17/136,470

(22) Filed: Dec. 29, 2020

(65) Prior Publication Data

US 2021/0217934 A1 Jul. 15, 2021

(30) Foreign Application Priority Data

Jan. 9, 2020 (JP) .............................. JP2020-002214
Nov. 20, 2020 (KR) ......................... 10-2020-0157041

(51) Int. Cl.
*H01L 33/50* (2010.01)
*H01L 33/60* (2010.01)
*H01L 27/15* (2006.01)

(52) U.S. Cl.
CPC .......... *H01L 33/504* (2013.01); *H01L 27/156* (2013.01); *H01L 33/60* (2013.01)

(58) Field of Classification Search
None
See application file for complete search history.

(56) References Cited

U.S. PATENT DOCUMENTS

| 2018/0047880 A1 | 2/2018 | Lim et al. |
| 2019/0229235 A1* | 7/2019 | Iguchi ..................... H01L 33/38 |
| 2019/0378873 A1 | 12/2019 | Lee et al. |

FOREIGN PATENT DOCUMENTS

| JP | 2018-205456 | 12/2018 |
| KR | 10-2017-0039062 | 4/2017 |
| KR | 10-2018-0039818 | 4/2018 |
| KR | 10-2019-0127413 | 11/2019 |

OTHER PUBLICATIONS

International Search Report dated Apr. 29, 2021 in corresponding International Application No. PCT/KR2021/000072.

* cited by examiner

*Primary Examiner* — Robert K Carpenter
(74) *Attorney, Agent, or Firm* — Nixon & Vanderhye P.C.

(57) ABSTRACT

Disclosed herein is a light emitting device and a display apparatus capable of improving design freedom. A package is provided with light extraction regions LR, LG, and LB and a partition region D provided on an outside of the light extraction regions LR, LG, and LB. The package includes an LED provided in the light extraction regions LR, LG, and LB and configured to emit light of a predetermined wavelength range and wavelength conversion layers 13R, 13G and 13B provided in the light extraction regions LR, LG, and LB and configured to convert the wavelength of light emitted from the LED. The package includes a wall portion provided in the partition region D and a first laminated portion provided in the partition region D and including a material different from a material forming the wall portion.

18 Claims, 9 Drawing Sheets

LIGHT EMITTING DEVICE AND DISPLAY APPARATUS

CROSS-REFERENCE TO RELATED APPLICATIONS

This application is based on and claims priority under 35 U.S.C. § 119 to Korean Patent Application No. 10-2020-0157041, filed on Nov. 20, 2020, in the Korean Intellectual Property Office, and to Japanese Patent Application No. 2020-002214, filed on Jan. 9, 2020 in the Japan Patent Office, the disclosures of which are incorporated by reference herein in their entireties

BACKGROUND

1. Field

The disclosure relates to a light emitting device including a light emitting diode (LED) and a display apparatus using the same.

2. Description of Related Art

Recently, development of a display apparatus using a micro light emitting diode (LED) has been in progress (e.g., as set forth in Japanese Unexamined Patent Application Publication No. 2018-205456). The display apparatus includes a plurality of packages (light emitting devices) on a substrate. The package includes an LED, and a wavelength conversion layer configured to convert a wavelength of light emitted from the LED. For example, the light emitted from the LED is converted to light in a red wavelength range, light in a green wavelength range or light in a blue wavelength range and the light is extracted.

In such a display apparatus, it is appropriate to improve design freedom. By improving the design freedom, it becomes possible to flexibly respond to various demands. For example, it becomes possible to suppress deterioration of the light emitting device caused by a package mounting process during a manufacturing process. In addition, it becomes possible to suppress a decrease in light extraction efficiency and to suppress generation of stress to the light emitting device.

SUMMARY

Embodiments of the disclosure provide a light emitting device and a display apparatus capable of improving design freedom.

Additional aspects of the disclosure will be set forth in part in the description which follows and, in part, will be apparent from the description.

In accordance with an example embodiment of the disclosure, a light emitting device includes: a light emitting diode (LED) configured to emit light in a predetermined wavelength range, a wavelength conversion layer configured to convert a wavelength of light emitted from the LED, a wall portion provided around the LED and the wavelength conversion layer, and a first laminated portion laminated on the wall portion and including a material different from a material of the wall portion.

The wall portion may include a light reflective material, and the first laminated portion may include a light-shielding material.

At least one portion of the first laminated portion may protrude beyond a surface of the wavelength conversion layer with respect to a light extraction direction.

The light emitting device may further include a band pass filter configured to transmit light in a specific wavelength range among light transmitted through the wavelength conversion layer, and at least one portion of the first laminated portion may protrude beyond a surface of the band pass filter with respect to a light extraction direction.

The light emitting device may further include a second laminated portion laminated on the first laminated portion.

The second laminated portion may include an inorganic material.

The second laminated portion may include carbon or silicon oxide.

A height of the second laminated portion may be 2 µm or more.

The light emitting device may further include a band pass filter configured to transmit light in a specific wavelength range among light transmitted through the wavelength conversion layer, and the second laminated portion may protrude beyond a surface of the band pass filter with respect to a light extraction direction.

The wavelength conversion layer may include at least one of a phosphor and a quantum dot.

The light emitting device may further include a plurality of light extraction regions partitioned by the wall portion, and the LED and the wavelength conversion layer may be provided in each of the plurality of light extraction regions.

In accordance with another example embodiment of the disclosure, a display apparatus includes a light emitting device and a substrate on which the light emitting device is mounted.

In accordance with another example embodiment of the disclosure, a display apparatus includes: a substrate, and a light emitting device provided on the substrate and including a light extraction region in which light in a predetermined wavelength range is configured to be extracted and a partition region provided on an outside of the light extraction region. The light emitting device includes a light emitting diode (LED) provided in the light extraction region, a wavelength conversion layer provided in the light extraction region surrounding at least one portion of the LED, a band pass filter provided on the wavelength conversion layer, a wall portion configured to partition the light extraction region and provided in the partition region, a first laminated portion laminated on the wall portion and including a material different from a material of the wall portion, and a second laminated portion provided on at least one of the light extraction region and the partition region, wherein at least one portion of the second laminated portion protrudes beyond the band pass filter in a light extraction direction.

The display apparatus may further include a LED driver configured to drive the LED, and a processor configured to control the LED driver The second laminated portion may be laminated on at least one of the wavelength conversion layer, the band pass filter and the first laminated portion.

The first laminated portion may include a light-shielding material.

The second laminated portion may include an inorganic material.

The second laminated portion may include carbon or silicon oxide.

A height of the second laminated portion may be 2 µm or more.

The wall portion may include a light reflective material.

BRIEF DESCRIPTION OF THE DRAWINGS

The above and other aspects, features and advantages of certain embodiments of the present disclosure will be more apparent following detailed description, taken in conjunction with the accompanying drawings, in which.

DETAILED DESCRIPTION

Figure 1:
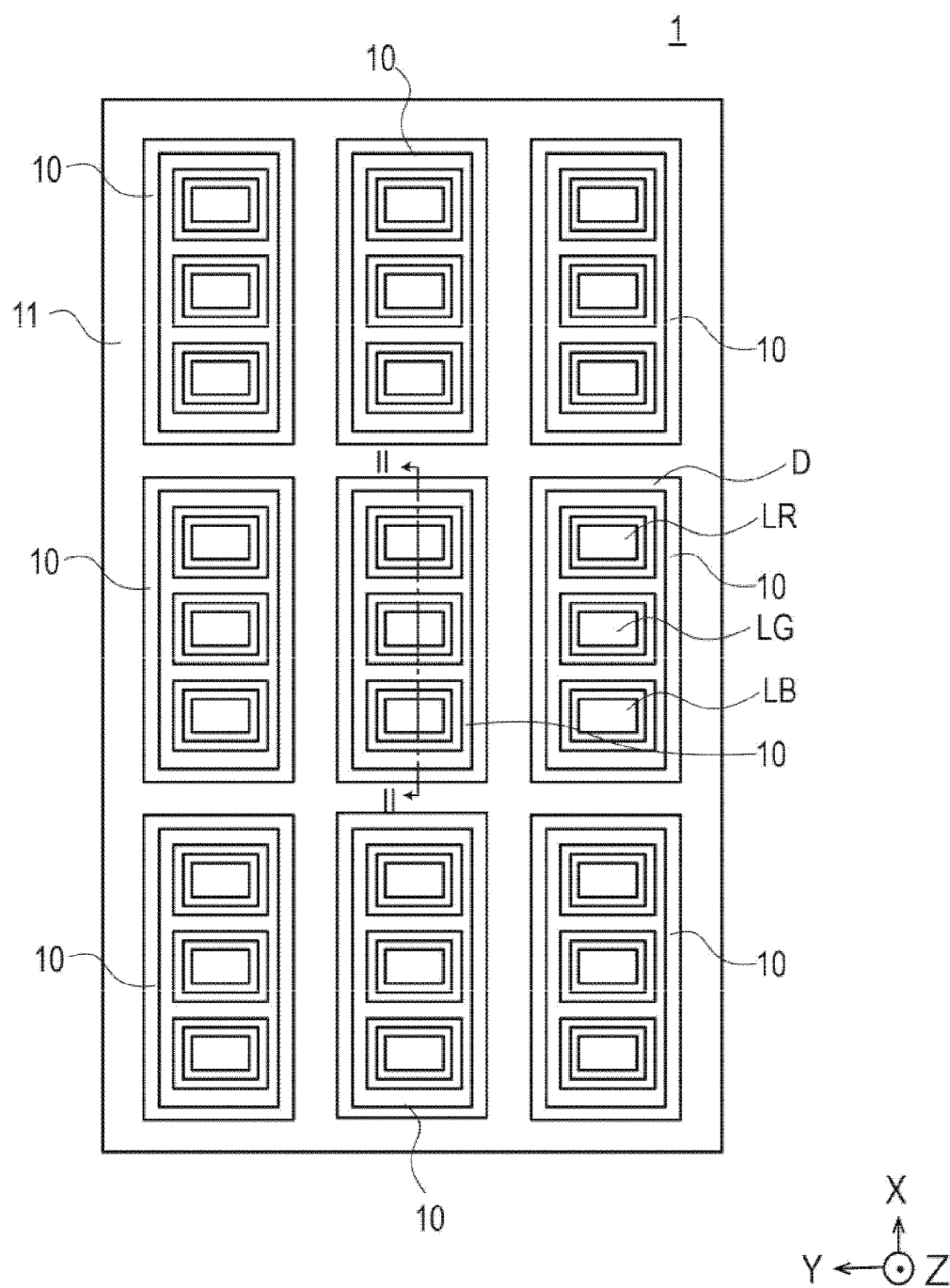
FIG. 1 is a plan view illustrating an example configuration of a display apparatus according to various embodiments.

Hereinafter various example embodiments of the disclosure will be described in greater detail with reference to the accompanying drawings. In the following drawings, the same reference numerals refer to the same elements, and the size of each element in the drawings may be exaggerated for clarity and convenience of description. The embodiments described below are merely examples, and various modifications may be made from these embodiments.

In the following, when a member is "upper side", "above" or "on" another, this includes not only when the member in contact with the other member, but also when there is another member between the two members.

As used herein, the singular forms "a," "an" and "the" are intended to include the plural forms as well, unless the context clearly indicates otherwise. When a part "includes" or "comprises" an element, unless there is a particular description contrary thereto, the part may further include other elements, not excluding the other elements.

In addition, the use of the term "the" and designating terms similar to "the" corresponds to both the singular and the plural.

In steps of the method, the steps are performed in an appropriate order unless the context clearly indicates otherwise. It is not necessarily limited to the order of description of the above steps. The use of all examples or illustrative terms (e.g., etc.) is merely for describing an example, and the scope is not limited by the above examples or illustrative terms.

Figure 2:
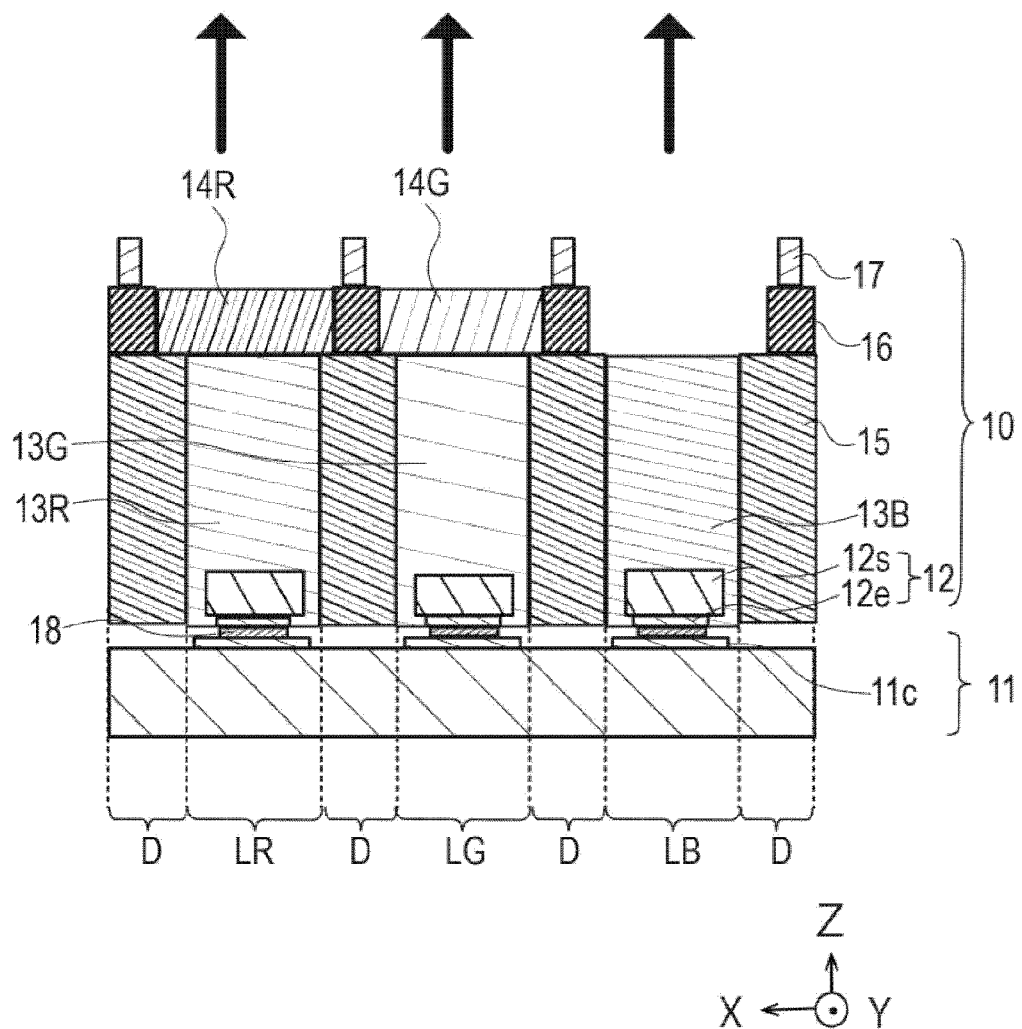
FIG. 2 is a cross-sectional view taken along line II-II shown in FIG. 1 according to various embodiments.

FIGS. 1 and 2 are diagrams illustrating an example configuration of a display apparatus 1 according to various embodiments. FIG. 1 is a plan view illustrating an example configuration of a display apparatus 1, and FIG. 2 is a cross-sectional view taken along line II-II illustrated in FIG. 1 according to various embodiments. A display apparatus 1 may, for example, be a display apparatus using micro light emitting diodes (LEDs), and the display apparatus 1 may include a plurality of packages 10 on a substrate 11 (refer to FIG. 1). For example, the packages 10 may be arranged in a matrix form on the substrate 11. In each package 10, light extraction regions LR, LG, and LB and a partition region D are provided. For example, the package 10 may include a monolithic structure, and may correspond to a sub pixel of the display apparatus 1. The package 10 may, for example, correspond and refer to a specific example of the "light emitting device" of the disclosure.

For example, the light extraction regions LR, LG, and LB may have a rectangular planar shape (refer to FIG. 1). In the light extraction region LR, an LED 12, a wavelength conversion layer 13R, and a band pass filter 14R are sequentially provided from the substrate 11 side (refer to FIG. 2). In the light extraction region LR, light emitted from the LED 12 is sequentially passed through the wavelength conversion layer 13R, and the band pass filter 14R and the light is extracted as light in a red wavelength range. "extraction" may refer, for example, to "selected and output" and it is also understood that "extraction" may refer, for example, to light in a specific range being extracted or output. In the light extraction region LG, an LED 12, a wavelength conversion layer 13G, and a band pass filter 14G are sequentially provided from the substrate 11 side. In the light extraction region LG, light emitted from the LED 12 is sequentially passed through the wavelength conversion layer 13G, and the band pass filter 14G and the light is extracted as light in a green wavelength range. In the light extraction region LB, an LED 12, a wavelength conversion layer 13B, are sequentially provided from the substrate 11 side. In the light extraction region LB, light emitted from the LED 12 is sequentially passed through the wavelength conversion layer 13B, and the light is extracted as light in a blue wavelength range. Accordingly, light in the specific wavelength range is extracted from the light extraction regions LR, LG, and LB. A direction of an arrow shown in FIG. 2 indicates a light extraction direction.

The partition region D is disposed on an outside of the light extraction regions LR, LG, and LB. The partition region D includes a frame shape surrounding each of the light extraction regions LR, LG, and LB. In other words, the light extraction regions LR, LG, and LB are separated from each other by the partition region D. In the partition region D, a wall portion 15, a first laminated portion 16, and a second laminated portion 17 may be sequentially provided from the substrate 11 side.

The substrate 11 may include a substrate configured to drive the LED 12, and for example, the substrate 11 may include a base and a wiring layer provided on the base. For example, the wiring layer may include a circuit pattern 11c connected to the LED 12, a Thin Film Transistor (TFT) connected to the circuit pattern 11c, and a wiring. The wiring layer may include other driving elements instead of the TFT. Alternatively, the display apparatus 1 may be a passive matrix driving type.

The LED 12 on the substrate 11 may include an electrode 12e and a semiconductor layer 12s sequentially arranged from the substrate 11 side. The electrode 12e may be bonded to the circuit pattern 11c via a bonding layer 18. The electrode 12e may be electrically connected to the circuit pattern 11c by the bonding layer 18. For example, the semiconductor layer 12s may include a gallium nitride (GaN)-based semiconductor material, and the LED 12 may emit light in the ultraviolet to blue wavelength range. In the light extraction regions LR, LG, and LB, the LED 12 are configured to emit light in the same wavelength range is provided.

The LED 12 may be a micro LED, and may have a rectangular planar shape. For example, a size of one side of this rectangle may be in a range of about 1 μm or more and 100 μm or less. For example, the LED 12 may have a three-dimensional shape such as, a substantially rectangular parallelepiped or substantially a cube.

Figure 9:
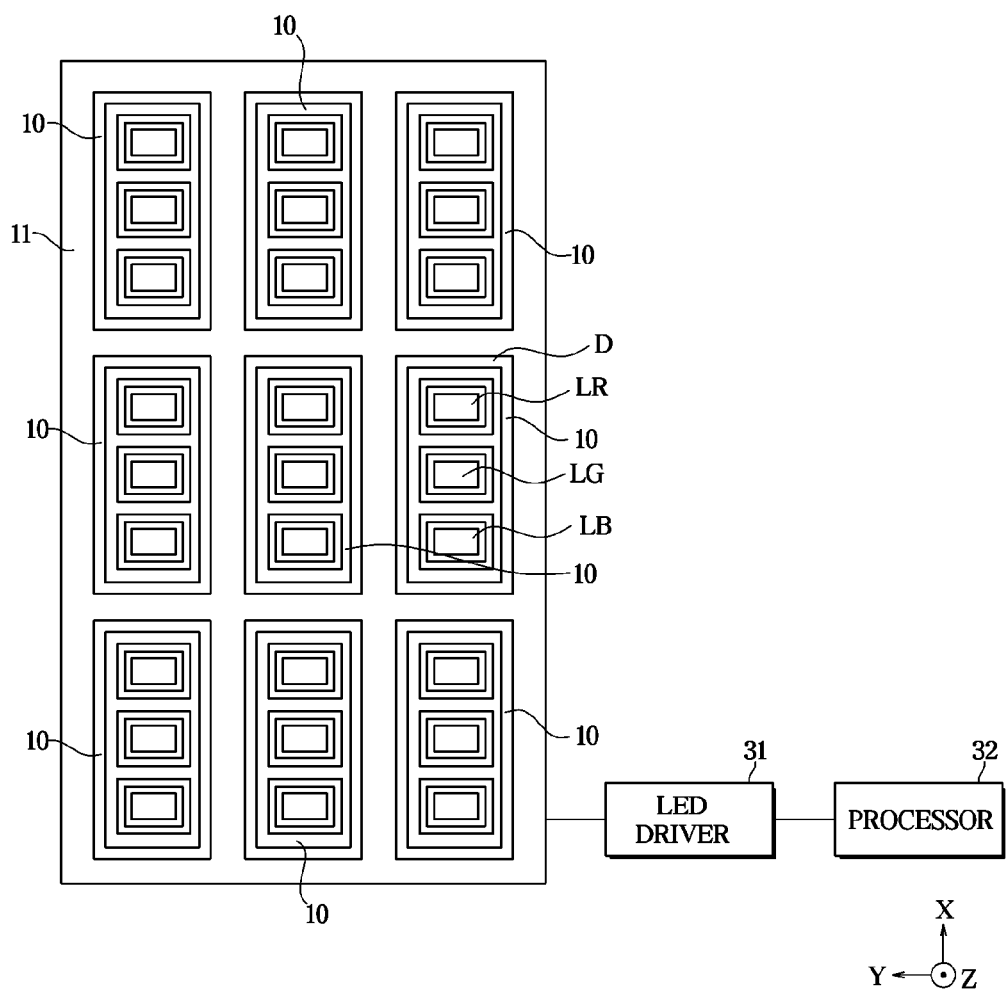
FIG. 9 is a plan view illustrating an example configuration of an example display apparatus including a light emitting diode (LED) driver and a processor according to various embodiments.

According to an embodiment, an LED driver 31 and a processor (e.g., including processing circuitry) 32 may be provided (refer to FIG. 9). The LED driver 31 may be electrically connected to the LED 12 to drive the LED 12. The processor 32 may be electrically connected to the LED driver 31 to control the LED driver 31. The processor 32 may output a drive signal and transmit the drive signal to the LED driver 31, and the LED driver 31 may apply the drive signal, which is received from the processor 32, to the LED 12. For example, whether or not the LED emits light, an amount and intensity of light emitted by the LED may be adjusted based on the drive signal applied to the LED 12. FIG. 9 illustrates that the LED driver 31 and the processor 32 are provided on the outside of the substrate 11, but is not limited thereto. Alternatively, the LED driver 31 and the processor 32 may be mounted inside the substrate 11.

The wavelength conversion layers 13R, 13G, and 13B are provided on the substrate 11 covering the LED 12. The wavelength conversion layers 13R, 13G, and 13B may be surrounded by a bottom surface of the LED 12 (a surface on the substrate 11 side). For example, a part of the electrode 12e (a bonding surface with the bonding layer 18) of the LED 12 may be exposed from the wavelength conversion layers 13R, 13G, and 13B. For example, the wavelength conversion layers 13R, 13G, and 13B may include a wavelength conversion material and a binder. For example, the wavelength conversion material may include a phosphor or a quantum dot, and converts a wavelength of light emitted from the LED 12. The wavelength conversion layer 13R includes a wavelength conversion material configured to convert the wavelength of light emitted from the LED 12 into light in the red wavelength range. The wavelength conversion layer 13G includes a wavelength conversion material configured to convert the wavelength of light emitted from the LED 12 into light in the green wavelength range. The wavelength conversion layer 13B includes a wavelength conversion material configured to convert the wavelength of light emitted from the LED 12 into light in the blue wavelength range. For example, the binder may include a resin material such as a silicone resin, an epoxy resin, or an acrylic resin. For example, a wavelength conversion material may be dispersed in the binder.

The band pass filters 14R and 14G on the wavelength conversion layers 13R and 13G selectively transmit light in a specific wavelength range. The band pass filter 14R selectively transmits light in the red wavelength range, and the band pass filter 14G selectively transmits light in the green wavelength range. For example, the band pass filters 14R and 14G transmit light in a specific wavelength range among light transmitted through the wavelength conversion layers 13R and 13G.

For example, the band pass filters 14R and 14G do not transmit light, in which wavelength is not converted in the wavelength conversion layers 13R and 13G. By providing the band pass filters 14R and 14G, it is possible to increase the color purity of light extracted from the light extraction regions LR and LG. For example, the band pass filters 14R and 14G may include a resin material. An Ultraviolet (UV) cut filter may be provided on the wavelength conversion layer 13B.

The wall portion 15 may include a partition configured to partition the light extraction regions LR, LG, and LB. In other words, a region divided by the wall portion 15 is the light extraction regions LR, LG, and LB. A height of the wall portion 15 (a size in the light extraction direction, e.g., a size in a Z direction in FIG. 2) is substantially the same as a thickness of the wavelength conversion layers 13R, 13G, and 13B. In other words, with respect to the light extraction direction, a surface of the wavelength conversion layers 13R, 13G, and 13B is disposed at substantially the same position as a position of an end surface of the wall portion 15 (an end surface in the light extraction direction). The surface of the wavelength conversion layers 13R, 13G, and 13B may refer to a surface in the light extraction direction. It is appropriate that the wall portion 15 has light reflection characteristics for light in the wavelength range emitted from the LED 12 and light in the wavelength range converted by the wavelength conversion layers 13R, 13G, and 13B. At least the surface of the wall portion 15 facing the wavelength conversion layers 13R, 13G, and 13B may have light reflection characteristics. Accordingly, light, which is directly directed to the wall portion 15 from the LED 12, or light, which is directed to the wall portion 15 from the LED 12 through the wavelength conversion layers 13R, 13G, and 13B, is reflected from the wall portion 15. Therefore, the use efficiency of the light emitted from the LED 12 is increased, and thus the light extraction efficiency may be improved. For example, the wall portion 15 may include a white pigment and a resin material. A photocurable resin material may be used as the resin material.

For example, the first laminated portion 16 on the wall portion 15 may include a black matrix layer, and the first laminated portion 16 is configured to prevent and/or reduce color of light from being mixed among the wavelength conversion layers 13R, 13G, and 13B adjacent to each other. The first laminated portion 16 may include a material different from a material of the wall portion 15. For example, the first laminated portion 16 may include a light-shielding material and a resin material. For example, the light-shielding material may include a black pigment or a dye. By providing the first laminated portion 16, it is possible to improve contrast of the display apparatus 1.

For example, the first laminated portion 16 may be provided in a selective region on the wall portion 15, and a width of the first laminated portion 16 (a size in an X direction in FIG. 2) may be less than a width of the wall portion 15. In other words, a size of an opening of the first laminated portion 16 may be greater than the size of the light extraction regions LR, LG, and LB. The band pass filters 14R and 14G are provided in the openings of the first laminated portion 16.

For example, a thickness of the first laminated portion 16 (a size in the light extraction direction, that is, a size in the Z direction in FIG. 2) may be substantially the same as a thickness of the band pass filters 14R and 14G. In other words, with respect to the light extraction direction, a surface of the band pass filters 14R and 14G may be disposed at substantially the same position as a position of a surface of the first laminated portion 16. The surface of the first laminated portion 16 and the surface of the band pass filters 14R and 14G refer to a surface in the light extraction direction. Further, with respect to the light extraction direction, the first laminated portion 16 may protrudes beyond the surface of the wavelength conversion layer 13B. The whole first laminated portion 16 may protrude beyond the surface of the wavelength conversion layer 13B, or a part of the first laminated portion 16 may protrude beyond the surface of the wavelength conversion layer 13B.

For example, the second laminated portion 17 may be provided in a selective region in the first laminated portion 16. The second laminated portion 17 is configured to protect the band pass filters 14R, and 14G and the wavelength conversion layers 13R, 13G, and 13B, etc. in the manufacturing process (described later). With respect to the light extraction direction, the second laminated portion 17 may protrude beyond the surface of the band pass filters 14R and 14G. The whole second laminated portion 17 may protrude beyond the surface of the band pass filters 14R and 14G, or a part of the second laminated portion 17 may protrude beyond the surface of the band pass filters 14R and 14G. Details will be described later, but according to an embodiment, because the second laminated portion 17 protruding beyond the surfaces of the band pass filters 14R and 14G is provided in the partition region D, it is possible to suppress and/or reduce deterioration of the package 10.

A thickness of the second laminated portion 17 (a size in the light extraction direction, that is, a size in the Z direction in FIG. 2) is in a range of about 2 μm or more. Because the second laminated portion 17 has a thickness of 2 μm or more, the second laminated portion 17 protrudes with a sufficient size with respect to the band pass filters 14R and 14G, and thus it is possible to effectively suppress and/or reduce the deterioration of the package 10. The second laminated portion 17 may be formed of an inorganic material such as carbon or silicon oxide ($SiO_2$). Where the second laminated portion 17 is formed of an inorganic material, it is possible to suppress deterioration of the second laminated portion 17 even at a high temperature during the manufacturing process. The second laminated portion 17 may be formed in a matte black. Where the second laminated portion 17 is in a matte black, it is possible to prevent and/or reduce external light from being reflected in the second laminated portion 17.

For example, the band pass filters 14R and 14G, the wavelength conversion layer 13B, and the second laminated portion 17 may be covered with a sealing plate (not shown). The sealing plate faces the substrate 11 with the band pass filters 14R and 14G, the wavelength conversion layer 13B, with the second laminated portion 17 interposed therebetween, and the sealing plate may be bonded to the substrate 11 by an adhesive layer. A thickness of the adhesive layer may be in a range of about 1 μm. For example, a resin sheet or a glass substrate may be used as the sealing plate.

FIGS. 3, 4, 5 and 6 are cross-sectional views sequentially illustrating an example manufacturing process of the display apparatus 1 according to various embodiments.

Figure 3:
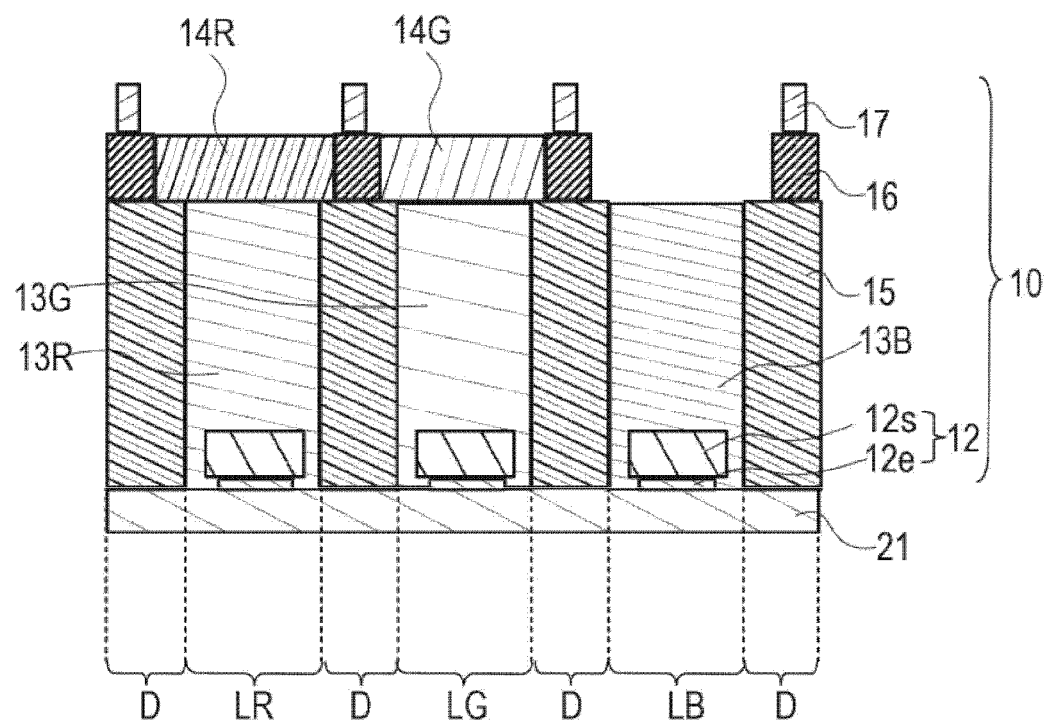
FIG. 3 is a cross-sectional view illustrating an example process of a manufacturing method of the display apparatus shown in FIG. 1 according to various embodiments.

The plurality of packages 10 are formed on a first temporary fixing substrate 21 (refer to FIG. 3). Each of the plurality of packages 10 may be formed as follows.

As for the LED 12, a GaN-based semiconductor layer may be grown on a growth substrate so as to form a semiconductor wafer, and the semiconductor wafer is divided. The LED 12 is mounted on the first temporary fixing substrate 21. An electrode of the LED 12 is disposed to be in contact with the first temporary fixing substrate 21. The wall portion 15 may then be formed. In a process of forming the wall portion 15, a resin material including a white pigment is applied to the first temporary fixing substrate 21. The wall portion 15 is formed by patterning a resin material including the white pigment. A patterning shape of the wall portion 15 may be controlled using a mask. In the patterning, after the resin material is cured by ultraviolet irradiation, unnecessary portions are removed by wet cleaning.

After the wall portion 15 is formed on the first temporary fixing substrate 21, the wavelength conversion layers 13R, 13G, and 13B are formed. In a process of forming the wavelength conversion layers 13R, 13G, and 13B, a resin material including a wavelength conversion material is applied to a region partitioned by the wall portion 15. The wavelength conversion layers 13R, 13G, and 13B may be formed by patterning a resin material including the wavelength conversion material. In the patterning, after the resin material is cured by the ultraviolet irradiation, unnecessary portions are removed by cleaning. After the wavelength conversion layers 13R, 13G and 13B are formed, the first laminated portion 16 and the band pass filters 14R and 14G are formed. After the first laminated portion 16 and the band pass filters 14R and 14G are formed, the second laminated portion 17 is formed. For example, the second laminated portion 17 is formed by depositing silicon oxide using a sputtering method, and patterning it. Alternatively, the second laminated portion 17 may be formed by dispersing the inorganic material in a solvent and then by applying the inorganic material dispersed in the solvent to the first laminated portion 16. However, the disclosure is not limited to any specific method and any suitable method may be used.

Figure 4:
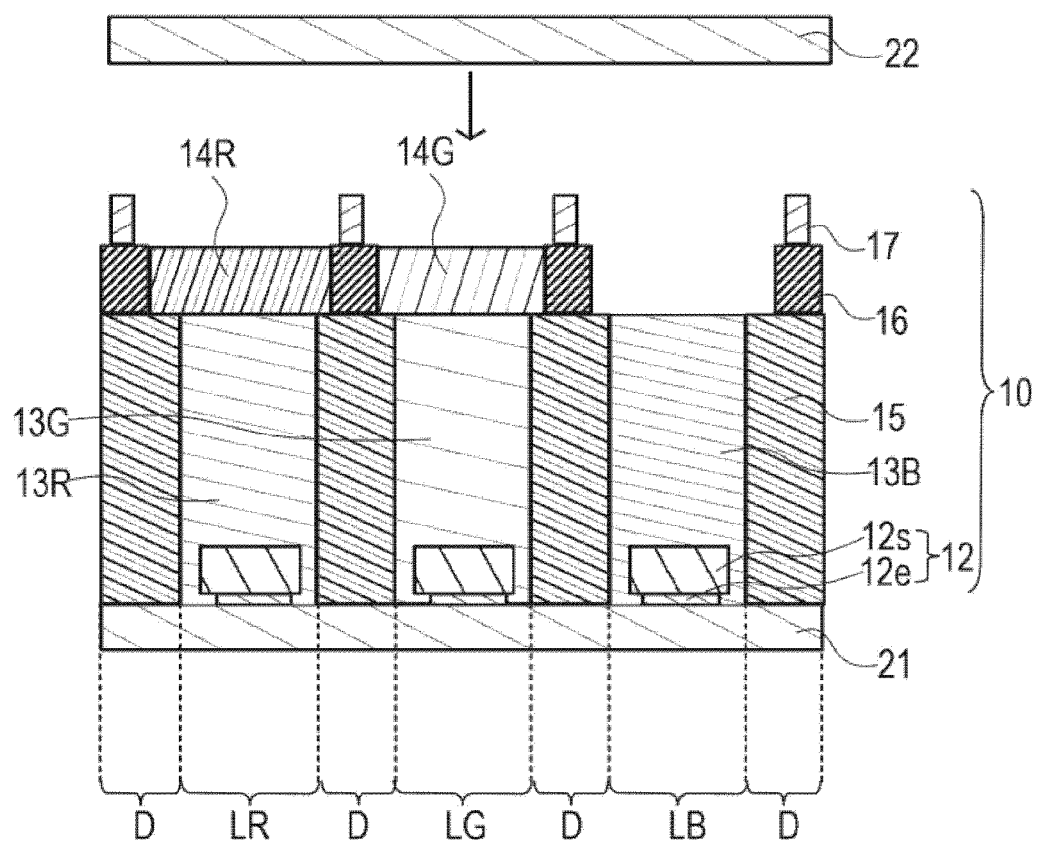
FIG. 4 is a cross-sectional view illustrating an example process following the process illustrated in FIG. 3 according to various embodiments.
Figure 5:
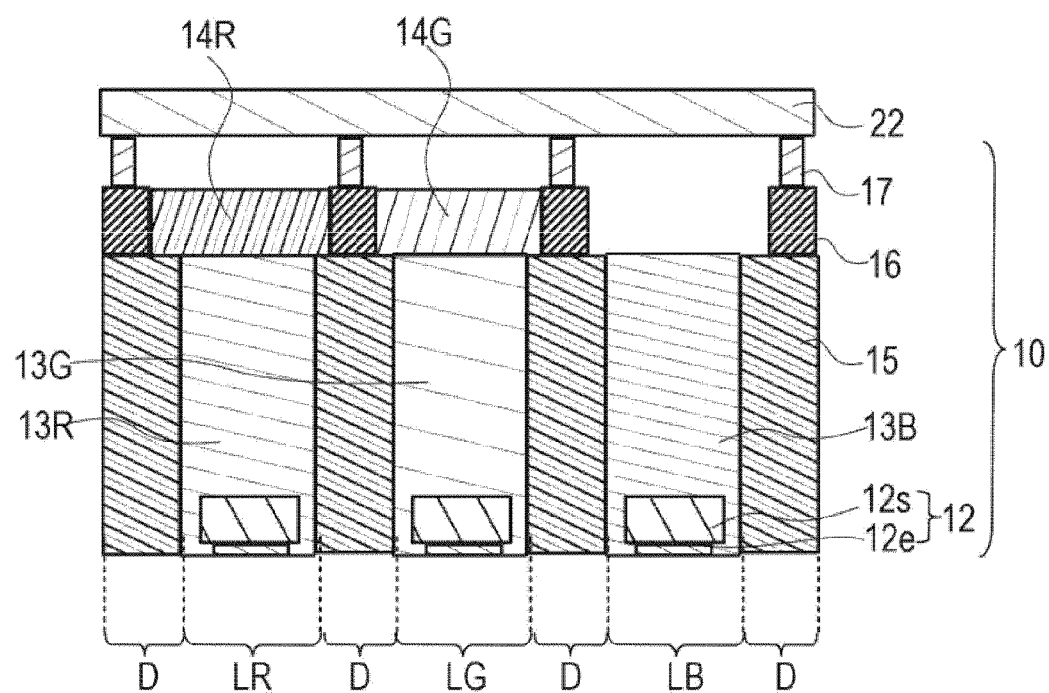
FIG. 5 is a cross-sectional view illustrating an example process following the process illustrated in FIG. 4 according to various embodiments.

After the plurality of packages 10 is formed on the first temporary fixing substrate 21, a second temporary fixing substrate 22 is placed to face the first temporary fixing substrate 21 with the plurality of packages 10 interposed therebetween (refer to FIG. 4). In this case, the second laminated portion 17 is disposed on the second temporary fixing substrate 22 side. Sequentially, the plurality of packages 10 is transferred to the second temporary fixing substrate 22 from the first temporary fixing substrate 21, and then the first temporary fixing substrate 21 is removed (refer to FIG. 5). In the package 10, the second laminated portion 17 protruding beyond the surface of the band pass filters 14R and 14G is provided. Accordingly, the package 10 is in contact with the second temporary fixing substrate 22 only in the partition region D. In the light extraction regions LR, LG, and LB, a gap is formed between the surface of the band pass filters 14R and 14G and the second temporary fixing substrate 22 and between the surface of the wavelength conversion layer 13B and the second temporary fixing substrate 22.

Figure 6:
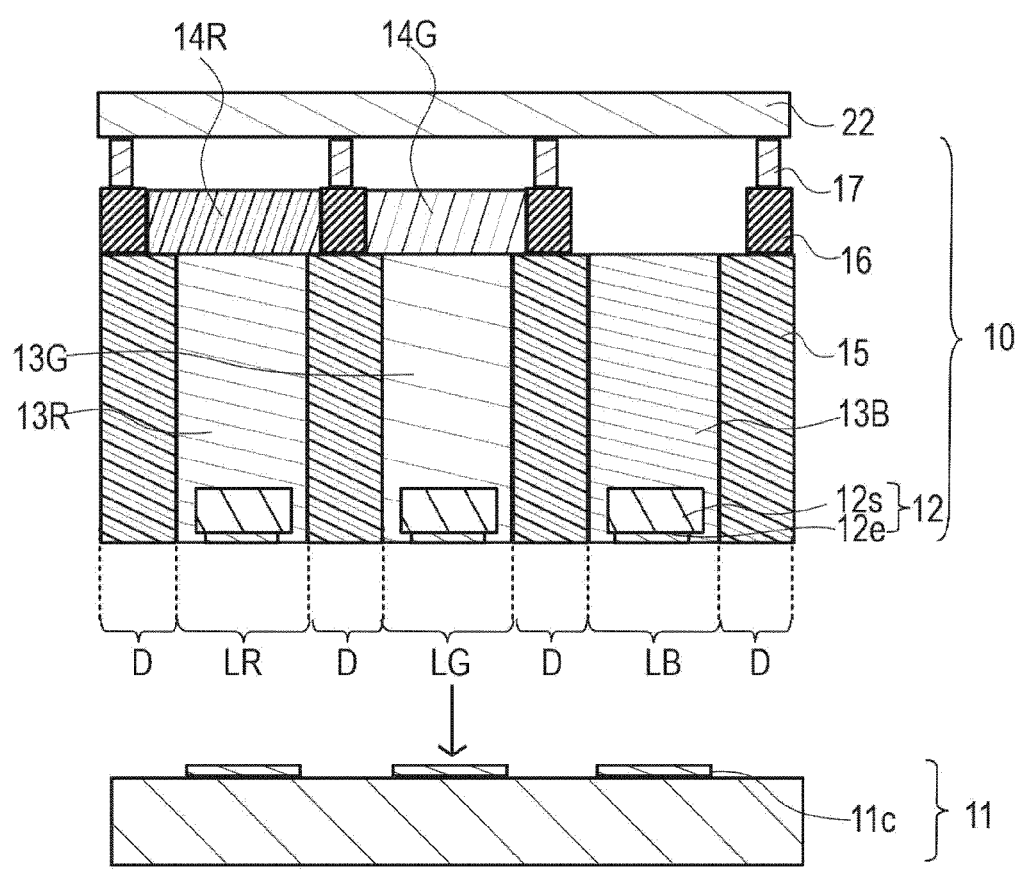
FIG. 6 is a cross-sectional view illustrating an example process following the process illustrated in FIG. 5 according to various embodiments.

After the plurality of packages 10 is transferred to the second temporary fixing substrate 22, the substrate 11 is placed to face the second temporary fixing substrate 22 with the plurality of packages 10 interposed therebetween (refer to FIG. 6). Sequentially, the plurality of packages 10 is mounted to the substrate 11 (e.g., including the circuit pattern 11c). For example, mounting of the plurality of packages 10 on the substrate 11 is performed using a method such as laser ablation or batch heat press. By using the method such as laser ablation or batch heat press, batch mounting or ultra-high speed mounting of the plurality of packages 10 may be performed. In the process of mounting the package 10, it is difficult for heat and pressure, which are applied to the second temporary fixing substrate 22, to be transmitted to the band pass filters 14R and 14G and the wavelength conversion layers 13R, 13G and 13B due to the gap between the surfaces of the band pass filters 14R and 14G and the second temporary fixing substrate 22 and the gap between the surface of the wavelength conversion layer 13B and the second temporary fixing substrate 22. Accordingly, it is possible to suppress and/or reduce deterioration of the package 10.

After the plurality of packages 10 is mounted to the substrate 11, a sealing plate is bonded to the substrate 11 with the plurality of packages 10 interposed therebetween. Therefore, the display apparatus 1 may be manufactured in the above mentioned method.

According to an embodiment, because the first laminated portion 16 including the material different from the material of the wall portion 15 is provided in the partition region D in the package 10 and the display apparatus 1, it becomes easy to adjust the structure and function of the partition region D. For example, by providing the first laminated portion 16 including a light-shielding material, it is possible to suppress the occurrence of color mixture between the adjacent light extraction regions LR, LG, and LB. Accordingly, it is possible to improve the design freedom in the package 10 and the display apparatus 1.

Further, by providing the second laminated portion 17 on the first laminated portion 16, it becomes easier to adjust the structure and function of the partition region D. For example, the package 10 is provided with the second laminated portion 17 protruding beyond the surface of the band pass filters 14R and 14G in the light extraction direction.

By providing the second laminated portion 17 protruding beyond the surfaces of the band pass filters 14R and 14G, it is possible to suppress and/or reduce deterioration of the package 10 in the manufacturing process of the package 10. Hereinafter an action and effect will be described.

In the process of mounting the plurality of packages 10 to the substrate 11 from the second temporary fixing substrate 22 (refer to FIG. 6), heat and pressure are applied to the package 10 in the light extraction direction caused by the process, such as laser ablation or hot pressing. In response to the heat and pressure being directly applied to the package 10 from the second temporary fixing substrate 22, the risk of deterioration of the package 10 may occur. For example, because resin materials, such as silicone resins or epoxy resins included in the wavelength conversion layers 13R, 13G, and 13B are more likely to deteriorate at high temperatures (for example, 300° C. or higher), there may be a risk of discoloration and cracking in the wavelength conversion layers 13R, 13G, and 13B. The deterioration of the wavelength conversion layers 13R, 13G and 13B may cause a decrease in luminous efficiency of the package 10 and causes inability to light. Further, the strong pressure applied to the package 100 may cause a difficulty such as, cracks, inability to light, electrical leakage, and voltage rise in the package 10.

On the other hand, the package 10 according to an embodiment includes the second laminated portion 17, and the second laminated portion 17 protrudes beyond the band pass filters 14R and 14G in the light extraction direction. Therefore, the gap between the second temporary fixing substrate 22 and the wavelength conversion layer 13B and the gap between the second temporary fixing substrate 22 and the band pass filters 14R and 14G are formed in the mounting process on the substrate 11. Due to the gap, heat and pressure transferred to the package 10 are alleviated, and thus deterioration of the package 10 may be suppressed and/or reduced. Therefore, it is possible to extend the life of the package 10.

Further, because the second laminated portion 17 is selectively provided in the partition region D, the influence of the second laminated portion 17 applied to the light extraction regions LR, LG, and LB may be suppressed. Hereinafter the effects of the disclosure will be described.

For example, the second laminated portion 17 may be provided in the partition region D and the light extraction regions LR, LG, and LB (for example, a package 10B shown in FIG. 8 to be described later). However, in such a package, there is a risk that the second laminated portion 17 has an influence on the light extracted from the package. For example, the light extraction efficiency of light extracted from the package may be reduced by a difference in refractive index or an interface influence in the vicinity of the second laminated portion 17. Further, the second laminated portion 17 may generate stress on the surfaces of the light extraction regions LR, LG, and LB.

On the other hand, in the package 10, the second laminated portion 17 is selectively provided in the partition region D between the partition region D and the light extraction regions LR, LG, and LB. Accordingly, it is possible to suppress and/or reduce the decrease in the light extraction efficiency and to suppress stress generation in the light extraction regions LR, LG, and LB caused by the second laminated portion 17. Therefore, it is possible to prevent and/or reduce the influence of the second laminated portion 17 from being applied to the light extraction regions LR, LG, and LB while it is possible to suppress deterioration of the package 10 caused by the mounting process on the substrate 11.

As described above, because the first laminated portion 16 including the material different from the material of the wall portion 15 is provided in the partition region D in the package 10 and the display apparatus 1, it becomes easy to adjust the structure and function of the partition region D. Accordingly, it is possible to improve the design freedom.

In addition, because the package 10 and the display apparatus 1 are provided with the second laminated portion 17 laminated on the first laminated portion 16, it is easier to adjust the structure and function of the partition region D. Accordingly, it is possible to further improve the design freedom. For example, the second laminated portion 17 protrudes beyond the surfaces of the band pass filters 14R and 14G in the light extraction direction. Accordingly, it is possible to suppress and/or reduce deterioration of the package 10 caused by the process of mounting the package 10.

Hereinafter an example of the package 10 according to an embodiment will be described. Detailed description of the same configuration as the package 10 of the above embodiment may not be repeated here to avoid redundant descriptions.

Figure 7:
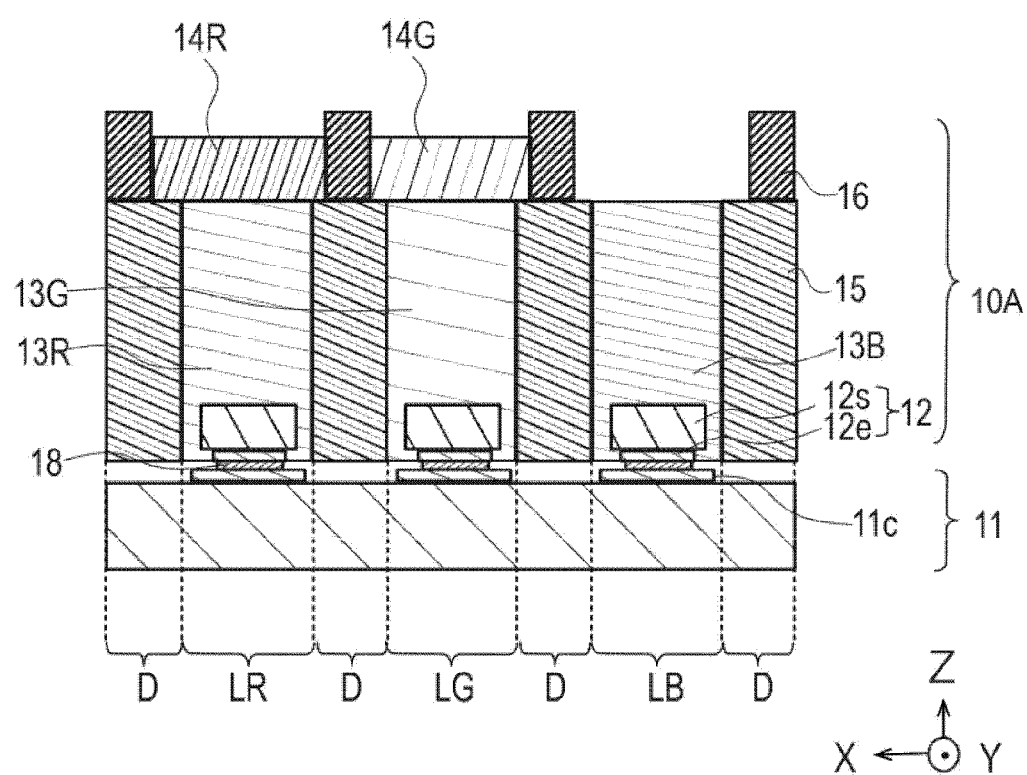
FIG. 7 is a cross-sectional view illustrating an example configuration of a package according to various embodiments.

FIG. 7 is a cross-sectional view illustrating an example configuration of a package (package 10A) according to various embodiments. FIG. 7 corresponds to FIG. 2 illustrating the package 10 according to an embodiment. The package 10A includes a wall portion 15 and a first laminated portion 16 in a partition region D, but the package 10A does not include a protective layer (that is the second laminated portion 17 in FIG. 2) on the first laminated portion 16. Except for this point, the package 10A according to this example includes substantially the same configuration as the package 10 described in the above embodiment.

For example, in the package 10A, a thickness of the first laminated portion 16 is greater than a thickness of the band pass filters 14R and 14G, and in the light extraction direction, a surface of the first laminated portion 16 protrudes beyond band pass filters 14R and 14G. By providing the first laminated portion 16, a gap is formed between the surfaces of the band pass filters 14R and 14G and a second temporary fixing substrate 22, and between a surface of a wavelength conversion layer 13B and the second temporary fixing substrate 22 in the manufacturing process of the display apparatus 1 (refer to FIG. 5). Accordingly, it is possible to suppress and/or reduce deterioration of the package 10 caused by the mounting process on the substrate 11.

Figure 8:
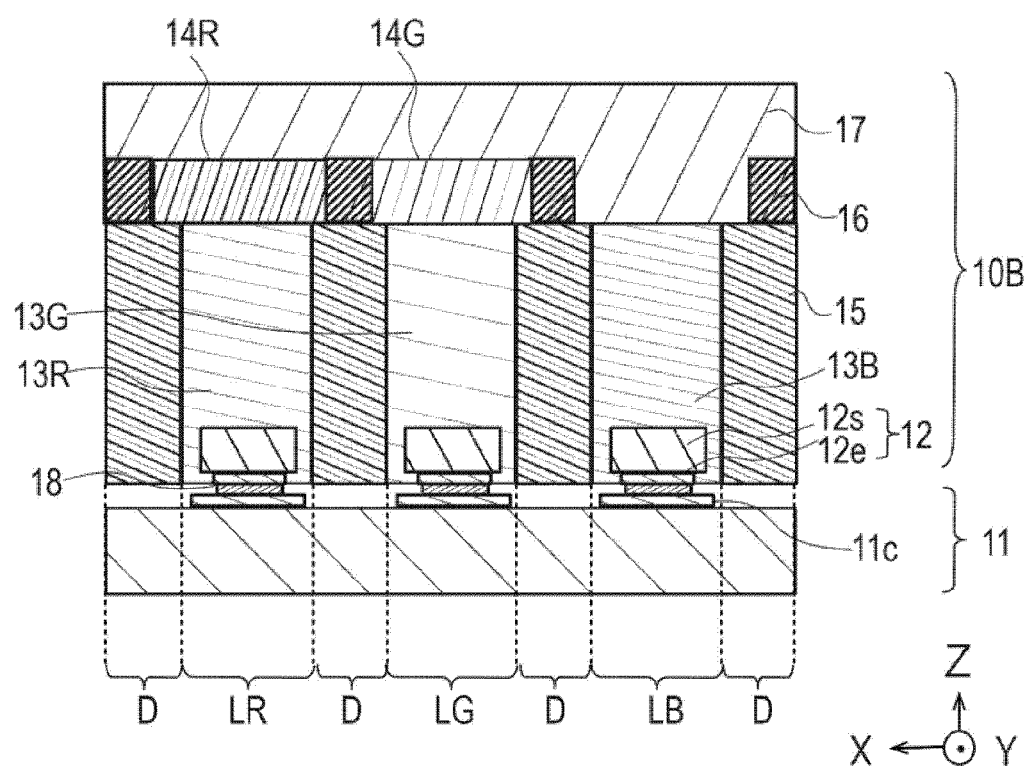
FIG. 8 is a cross-sectional view illustrating an example configuration of a package according to various embodiments.

FIG. 8 is a cross-sectional view illustrating an example configuration of a package (package 10B) according to various embodiments. FIG. 8 corresponds to FIG. 2 illustrating the package 10 according to an embodiment. The package 10B includes a second laminated portion 17 in a wall portion 15 and in light extraction regions LR, LG, and LB. Except for this point, the package 10B according to the modified example 2 includes the same or similar configuration as the package 10 described in the above embodiment. Because the second laminated portion 17 is provided in the partition region D and the light extraction regions LR, LG, and LB, it becomes easy to form the second laminated portion 17.

The configurations of the packages 10, 10A and 10B and the display apparatus 1 including the same described above are provided to describe example configurations in the description of the features of the above-described embodiments, but are not limited to the above configurations. Therefore, the configurations may be modified without departing from the scope of the claims, and it does not exclude configurations that may be included in a general display apparatus.

For example, the case in which the first laminated portion is the first laminated portion 16 has been described according to the above mentioned embodiment, but the first laminated portion may include a layer having different functions.

In addition, the case in which the LED 12 emits light in the ultraviolet to blue wavelength range has been described according to the above mentioned embodiment, but the LED 12 may emit light in a different wavelength range. Alternatively, the LED 12 configured to emit light in different wavelengths may be provided in the light extraction regions LR, LG, and LB.

In addition, the case of extracting light in the red wavelength range, light in the green wavelength range, and light in the blue wavelength range from the package 10 has been described according to the above mentioned embodiment, but the wavelength range of light extracted from the package 10 is not limited thereto.

As is apparent from the above description, the light emitting device and the display apparatus may easily adjust the structure and function of the vicinity of the LED and the wavelength conversion layer because the first laminated portion including a material different from a material forming the wall portion is laminated in the wall portion. Therefore, it is possible to improve the design freedom. For example, the second laminated portion may be further laminated on the first laminated portion around the LED and the wavelength conversion layer. Accordingly, it becomes possible to suppress and/or reduce the deterioration of the light emitting device caused by the package mounting process during the manufacturing process. Further, because the second laminated portion is provided around the LED and the wavelength conversion layer, it becomes possible to suppress the decrease in the light extraction efficiency and to suppress generation of stress on the light emitting device.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:

1. A light emitting device comprising:
   a light emitting diode (LED) configured to emit light in a predetermined wavelength range;
   a wavelength conversion layer configured to convert a wavelength of light emitted from the LED;
   a wall portion provided around the LED and the wavelength conversion layer;
   a plurality of light extraction regions partitioned by the wall portion; and
   a first laminated portion laminated on the wall portion and comprising a material different from a material of the wall portion, the first laminated portion extending from the wall portion;
   wherein at least one portion of the first laminated portion protrudes beyond a surface of the wavelength conversion layer with respect to a light extraction direction, and
   a width of the first laminated portion is less than a width of the wall portion so that a size of an opening of the first laminated portion is greater than a size of the light extraction regions.

2. The light emitting device of claim 1, wherein
   the wall portion comprises a light reflective material, and
   the first laminated portion comprises a light-shielding material.

3. The light emitting device of claim 1, further comprising:
   a band pass filter configured to transmit light in a specific wavelength range of light transmitted through the wavelength conversion layer,
   wherein at least one portion of the first laminated portion protrudes beyond a surface of the band pass filter with respect to a light extraction direction.

4. The light emitting device of claim 1, further comprising:
   a second laminated portion laminated on the first laminated portion.

5. The light emitting device of claim 4, wherein
   the second laminated portion comprises an inorganic material.

6. The light emitting device of claim 5, wherein
   the second laminated portion comprises carbon or silicon oxide.

7. The light emitting device of claim 4, wherein
   a height of the second laminated portion is 2 μm or more.

8. The light emitting device of claim 4, further comprising:
   a band pass filter configured to transmit light in a specific wavelength range of the light transmitted through the wavelength conversion layer,
   wherein the second laminated portion protrudes beyond a surface of the band pass filter with respect to a light extraction direction.

9. The light emitting device of claim 1, wherein
   the wavelength conversion layer comprises at least one of a phosphor and a quantum dot.

10. The light emitting device of claim 1, further comprising:
    a plurality of light extraction regions partitioned by the wall portion,
    wherein the LED and the wavelength conversion layer are provided in each of the plurality of light extraction regions.

11. A display apparatus comprising:
a light emitting device comprising a light emitting diode (LED) configured to emit light in a predetermined wavelength range, a wavelength conversion layer configured to convert a wavelength of light emitted from the LED, a wall portion provided around the LED and the wavelength conversion layer, and a plurality of light extraction regions partitioned by the wall portion, and a first laminated portion laminated on the wall portion and comprising a material different from a material of the wall portion, the first laminated portion extending from the wall portion, wherein at least one portion of the first laminated portion protrudes beyond a surface of the wavelength conversion layer with respect to a light extraction direction, and a width of the first laminated portion is less than a width of the wall portion so that a size of an opening of the first laminated portion is greater than a size of the light extraction regions;
a substrate on which the light emitting element is mounted;
an LED driver comprising circuitry configured to drive the LED; and
a processor configured to control the LED driver.

12. The display apparatus of claim 11, wherein
the wall portion comprises a light reflective material, and
the first laminated portion comprises a light-shielding material.

13. The display apparatus of claim 11, further comprising:
a band pass filter configured to transmit light in a specific wavelength range of light transmitted through the wavelength conversion layer,
wherein at least one portion of the first laminated portion protrudes beyond a surface of the band pass filter with respect to a light extraction direction.

14. The display apparatus of claim 11, further comprising:
a second laminated portion laminated on the first laminated portion.

15. The display apparatus of claim 14, wherein
the second laminated portion comprises an inorganic material.

16. The display apparatus of claim 14, wherein
a height of the second laminated portion is 2 μm or more.

17. The display apparatus of claim 14, further comprising:
a band pass filter configured to transmit light in a specific wavelength range of light transmitted through the wavelength conversion layer,
wherein the second laminated portion protrudes beyond a surface of the band pass filter with respect to a light extraction direction.

18. The display apparatus of claim 11, further comprising:
a plurality of light extraction regions partitioned by the wall portion,
wherein the LED and the wavelength conversion layer are provided in each of the plurality of light extraction regions.

* * * * *